United States Patent [19]
Tregilgas

[11] Patent Number: 6,143,630
[45] Date of Patent: Nov. 7, 2000

[54] METHOD OF IMPURITY GETTERING

[75] Inventor: John H. Tregilgas, Richardson, Tex.

[73] Assignee: Texas Instruments Incorporated, Dallas, Tex.

[21] Appl. No.: 08/255,588

[22] Filed: Jun. 9, 1994

[51] Int. Cl.[7] .................................................. H01L 21/322
[52] U.S. Cl. .......................... 438/476; 438/143; 438/473
[58] Field of Search .............................. 437/10, 12, 159; 438/143, 473, 476

[56] References Cited

U.S. PATENT DOCUMENTS

| | | | |
|---|---|---|---|
| 2,784,121 | 3/1957 | Fuller | 437/12 |
| 3,146,204 | 8/1964 | Aven | 437/159 |
| 3,549,434 | 12/1970 | Aven | 437/159 |
| 3,650,823 | 3/1972 | Mead | 437/12 |
| 3,795,547 | 3/1974 | Hall | 437/12 |
| 4,244,753 | 1/1981 | Harnack | 437/12 |
| 4,504,334 | 3/1985 | Schaake | 437/12 |

*Primary Examiner*—John F. Niebling
*Assistant Examiner*—Lynne A. Gurley
*Attorney, Agent, or Firm*—Carlton H. Hoel; W. James Brady; Frederick J. Telecky, Jr.

[57] ABSTRACT

A method of gettering impurities from substrates (304) such as CdTe and CdZnTe by formation of liquid droplets (306) of a lower melting point material such as Cd or Te on the substrate during an anneal. The droplets may form from the melting of a thin layer of the material which had been deposited on the substrate (304). A subsequent mechanical removal of the cooled and solidified droplets also removes the gettered impurities.

11 Claims, 2 Drawing Sheets

METHOD OF IMPURITY GETTERING

GOVERNMENT CONTRACT

This invention was made with Government support under contract (IRMP) MDA 972-91-C-0046. The Government has certain rights in this invention.

BACKGROUND OF THE INVENTION

The invention relates to electronic devices, and, more particularly, to photodetectors based on narrow bandgap semiconductor materials and the processing of such materials.

Alloys of mercury telluride with cadmium telluride, which are generically denoted $Hg_{1-x}Cd_xTe$, find extensive use as photosensitive semiconductors for infrared radiation detection. Indeed, the two atmospheric windows of greatest interest for infrared radiation detection are at 5–8 $\mu$m and 10–12 $\mu$m; and $Hg_{0.8}Cd_{0.2}Te$ has a bandgap of about 0.1 eV which corresponds to a photon wavelength of 12 $\mu$m and $Hg_{0.73}Cd_{0.27}Te$ has a bandgap of about 0.24 eV which corresponds to a photon wavelength of 5 $\mu$m. Both photodiode and photocapacitor detectors are used in detector arrays for infrared imaging.

Frequently, such photodetectors made in a thin film of $Hg_{1-x}Cd_xTe$ on a lattice-matched wide bandgap substrate such as CdTe or CdZnTe. These materials are all referred to as II–VI compounds because the constituent elements are from Groups II and VI of the periodic table. FIG. 1 illustrates a 50 $\mu$m thick film 102 of $Hg_{1-x}Cd_xTe$ on a CdTe substrate 104. The film may be grown on the substrate by various methods such as liquid phase epitaxy (LPE), metalorganic chemical vapor deposition (MOCVD), molecular beam exitaxy (MBE).

CdTe and CdZnTe and other substrates providing epitaxial support for $Hg_{1-x}Cd_xTe$ active thin films typically contain fast-diffusing impurities such as copper (Cu) as residual impurities. These impurities normally arise from traces in the starting elements (Cd, Zn, and Te) which are compounded to form the substrate and have typical levels on the order of $1 \times 10^{15}$ atoms/cm$^3$. Such impurities may limit performance of $Hg_{1-x}Cd_xTe$ thin films on the substrates because the impurities segregate into the thin film (suggested by erratic arrows in FIG. 1) and are electrically active p-type dopants. This may change the doping type in lightly doped n-type films. Indeed, Myers et al., Dopant diffusion in HgCdTe grown by photon assisted molecular-beam epitaxy, 10 J.Vac.Sci.Tech.B 1438 (1992), describe outdiffusion of Cu from such substrates.

Normally, such impurities are gettered to Te inclusions in the substrate. However, substrates without Te inclusions are desired and present a problem for thin film growth, especially by MOCVD and MBE, because of Cu segregation into the epitaxial film. To avoid this problem, higher purity and more costly substrates are required. Alternatively, substrates with minimal Te inclusions can have a pure sacrificial layer of $Hg_{1-x}Cd_xTe$ grown on them, then be annealed to getter the impurity into the sacrifical layer. Typically, the annealing would be performed at about 400° C. with a $Hg_{1-x}Cd_xTe$ layer having a melting point of about 800° C. See the Meyers et al. article. Lastly, remove the sacrificial layer. The sacrificial layer can be grown by MOCVD, MBE, LPE, etc., but such an approach is costly in both process complexity and time.

An alternative technique for gettering impurities is solvent extraction, as introduced by Aven and Woodbury in 1962, which anneals II–VI substrates (e.g., ZnS or ZnSe) at high temperatures in Zn melts. FIG. 2 illustrates solvent extraction with II–VI substrate 202 submerged in liquid melt 204; typically the Zn melt will be at about 800–1000° C. Similar solvent extraction has been performed on $Hg_{1-x}Cd_xTe$ with Hg or Te melts using annealing temperatures in the range of about 300–500° C. This approach frequently leads to heavy surface erosion and surface damage or dislocation slip if solvent is allowed to solidify on the substrate surface. In particular, solvent extraction in a Hg melt produces heavy erosion and is difficult to remove from the surface due to surface tension.

U.S. Pat. No. 4,504,334 describes a method of injecting Hg interstitials into a $Hg_{1-x}Cd_xTe$ substrate to segregate impurities towards a deposited layer of Te on the opposite side of the substrate for gettering. The gettering layer is in the high vacancy concentration $Hg_{1-x}Cd_xTe$ region adjacent to the deposited Te and not in the Te layer itself. The process preferably occurs at 280° C. but temperatures upwards of 450° C. are noted.

SUMMARY OF THE INVENTION

The present invention provides impurity gettering from substrates by a molten surface layer into which the impurity will segregate. This preserves the gettering as in solvent extraction but avoids the surface erosion associated with large melts. A further aspect for gettering of impurities from CdTe and CdZnTe type substrates is use of solid elemental Te, Zn, or Cd on the surface at temperatures close to the elements' melting points. The impurities are subsequently removed by etching or mechanical polishing of the gettering layer.

This has the advantage of simple gettering together with avoidance of the heavy surface erosion encountered during of solvent extraction with large melts.

BRIEF DESCRIPTION OF THE DRAWINGS

The drawings are schematic for clarity.

DESCRIPTION OF THE PREFERRED EMBODIMENTS

Overview

The preferred embodiments getter fast diffusing impurities in a substrate, such as Cu in CdZnTe, as follows. First deposit a film of a lower melting point phase, such as Cd, Te, or Zn, on the substrate. Then encapsulate and heat the coated substrate to a temperature above the melting point of the lower melting point phase; see FIG. 3. Anneal the substrate at this temperature for a time sufficient to allow impurities like Cu to be absorbed by the now-liquified film. After cooling, remove the now-solidified film, which contains the absorbed impurities, by selective etching, polishing, or diamond point turning. Thus fast diffusing impurities have been gettered and removed from the CdZnTe substrate.

Also, heating the lower melting point film to just below its melting point may make the still-solid film sufficiently impurity absorptive so that liquification of the film may not be needed while still providing good gettering of fast diffusing impurities.

An alternative embodiment condenses droplets from a vapor of the lower melting point material to form the liquid phase on the substrate surface. See FIG. 4; the lower melting point material need only be in vapor transport communication with the substrate, so other ampoule geometries could be used.

Evaporation and Annealing

The first preferred embodiment method getters Cu impurities from a CdZnTe substrate with the following steps.

(1) First, load a CdZnTe substrate, which typically is about 10 mm by 20 mm by 1 mm thick, into an evaporator and deposit by evaporation a 1 to 10 µm thick film of Cd onto the substrate.

Figure 1:
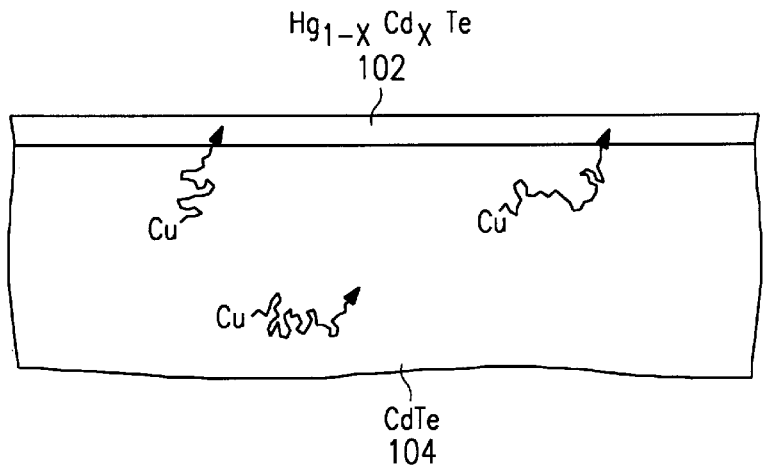
FIG. 1 illustrate a thin film on a substrate.
Figure 2:
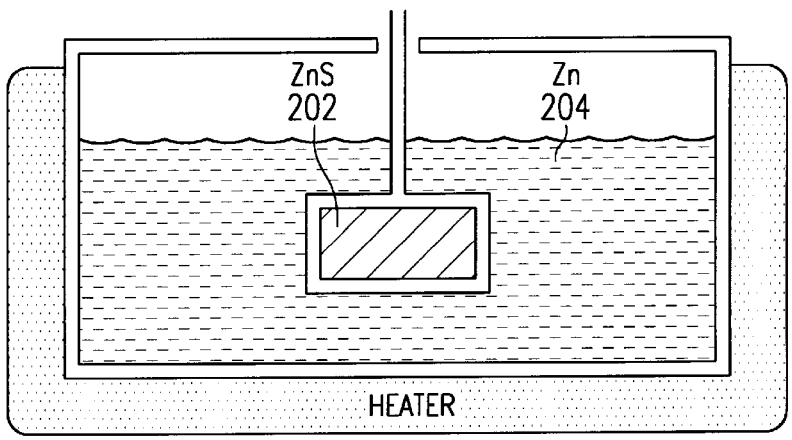
FIG. 2 shows mercury solvent extraction.
Figure 3:
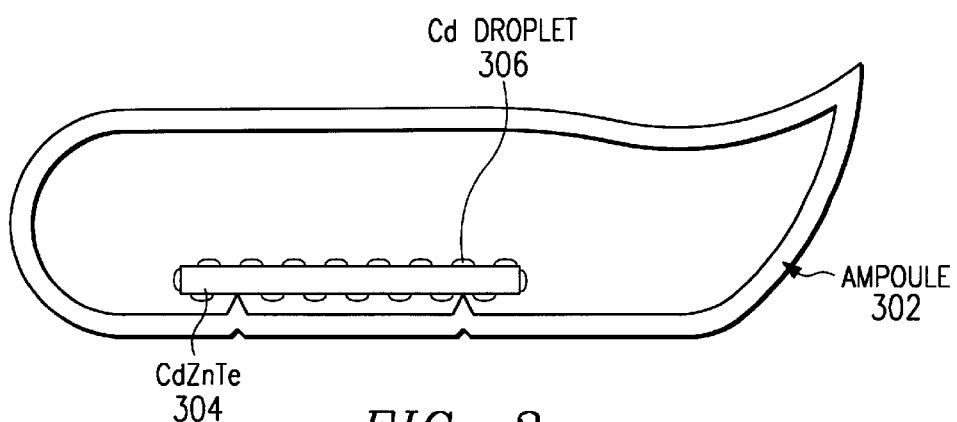
FIG. 3 is a cross sectional elevation view of an ampoule with a substrate plus liquified film gettering.

(2) Next, place the Cd-coated substrate into an ampoule and evacuate the ampoule to a vacuum of less than 1 mTorr and seal it shut. Then raise the temperature of the ampoule to about 350° C.; this melts the Cd film (Cd melting point about 321° C.) and vaporizes some Cd to reach the Cd equilibrium vapor pressure of about 300 mTorr. Surface tension in the liquified Cd will pull the Cd into droplets of average size on the order of the original film thickness. See FIG. 3 illustrating CdZnTe substrate 304 in ampoule 302 with droplets 306 of liquid Cd.

(3) Maintain the temperature of the ampoule with the liquid Cd on the CdZnTe substrate at 350° C. for about 15 hours to anneal the substrate plus allow the Cd droplets to absorb fast-diffusing impurities out of the substrate. Vapor transport of Cd from the droplets to any cool spots on the ampoule surface will remove some of the Cd from substrate 304; also, vapor transport will cause the larger droplets to increase in size at the expense of the smaller droplets. Note that anneals as short as 30 minutes may suffice, and fast diffusing species such as Cu, Fe, Ni, . . . will be absorbed. The original thickness of the Cd film (and thus the original total amount of Cd on the surface) depends upon the annealing temperature and duration: the Cd continuously vapor transports to cool spots, and a minimal amount of Cd must remain on the surface to perform the gettering.

(4) After the 15 hour anneal at 350° C., cool to room temperature. The droplets of Cd solidify. Then open the ampoule and extract solid-droplet coated substrate 304 and polish the surface with a diamond tool to remove the solidified Cd droplets together with their gettered impurities leaving a purified CdZnTe substrate. The droplets only create localized and small erosion pits in the substrate surface as compared to solvent extraction, but the gettering by droplets is about as effective as solvent extraction using large volumes of melt.

The surface density of the gettering droplets of Cd can be controlled simply by controlling the thickness of the evaporated film of Cd which forms the droplets upon melting.

Capping Layer

A variation of the first preferred embodiment deposits a capping layer on the Cd deposited layer. The capping layer may be made of higher melting point materials such as CdTe or ZnS. Then follow the remainder of the first preferred embodiment steps. The high melting point capping layer will not melt and will hold the Cd deposited layer in place even after it melts. Thus the original Cd layer may be thinner and the anneal temperature may be higher, such as 500° C., because the capping layer inhibits the vapor transport of the melted Cd from the substrate. Even a single layer of material such as Cd-rich CdTe could be used; the Cd will still getter well when above its melting point.

Figure 4:
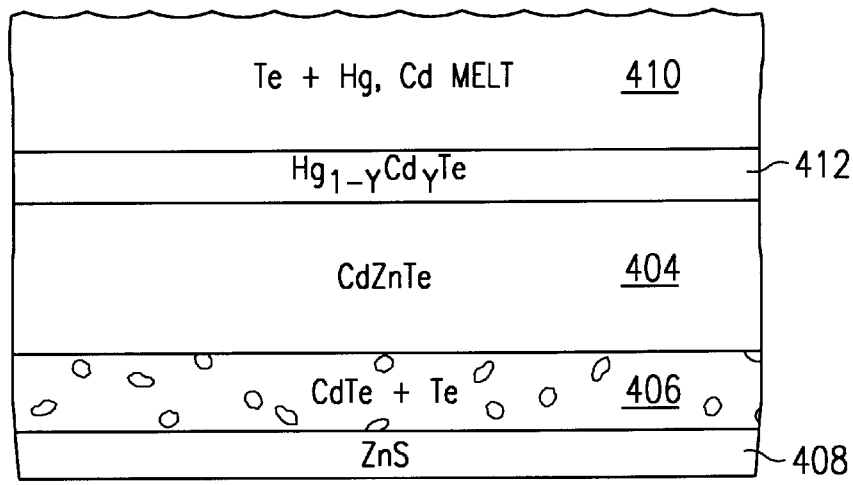
FIG. 4 illustrates epitaxy with a capped liquified gettering film.

FIG. 4 illustrates a further variation of the capping layer approach. CdZnTe substrate 404 has a backside layer 406 of CdTe having Te inclusions (the heuristic bodies) plus ZnS capping layer 408, and substrate 404 is immersed in Te melt 410 with dissolved Hg and Cd for liquid phase epitaxial growth of $Hg_{1-x}Cd_xTe$ film 412. The temperature of melt 410 typically falls in the range of 450° C. to 500° C., and thus the Te inclusions melt and getter impurities out of substrate 404 and also out of growing film 412. However, grown film 412 may have second phase Te which has gettered impurities; so after the growth, anneal substrate 404 plus $Hg_{1-x}Cd_xTe$ film 412 in a Hg atmosphere with backside gettering layer 406 plus capping layer 408 still attached. This annealing typically takes place in a temperature range of 400° C. to 480° C. and eliminates the second phase Te in $Hg_{1-x}Cd_xTe$ film 412. Thus the previously gettered impurities are released and can diffuse through substrate 404 to be gettered by the Te in still-attached layer 406. Note that the foregoing process differs from the U.S. Pat. No. 4,504,334 described in the background in that the foregoing process does not rely injection of metal (e.g., Hg) interstitials and does not have a high vacancy region of $Hg_{1-x}Cd_xTe$ adjacent the Te for gettering.

The liquid phase epitaxy of foregoing could be replaced by MOCVD or MBE to grow the $Hg_{1-x}Cd_xTe$ film, although these would typically be at lower temperatures: 350° C. for MOCVD and 200° C. for MBE.

Other Lower Melting Getterers

The lower melting point phase on the surface of the CdZnTe substrate ideally would have a low melting point plus a low vapor pressure to avoid vapor transport from the substrate to the ampoule walls. Other materials such as Zn (a melting point of about 419.5° C. and a vapor pressure of about 10 Torr at 600° C., and the vapor pressure drops to about 1.5 Torr at 500° C.) or Te (a melting point of about 449° C. and a vapor pressure of about 900 mTorr at 500° C.) or even gallium, bismuth, indium, lead, tin, and so forth which have low melting points and could be used as the gettering material. Also, alloys such as CdZn will lower the vapor pressure and have low melting points. Lastly, capping layers could be applied to any of the foregoing to limit vapor transport; even a single combined layer of low melting point plus capping layer such as the Te-rich CdTe layer in connection with FIG. 4.

Solid Te Gettering

An alternative to the preferred embodiment method uses solid Te on the substrate for gettering with the substrate temperature held between 300° C. and 449° C. (the melting point of Te). The Te may be evaporated onto the substrate and is roughly analogous to $Hg_{1-x}Cd_xTe$ gettering; but the Te is near (within 150° C.) its melting point which implies a large vacancy concentration and effective gettering, whereas the $Hg_{1-x}Cd_xTe$ is about 400° C. below its melting point. Also, the use of Te avoids use of Hg, which is toxic. As with the other embodiments, after the annealing, remove the surface gettering material together with the gettered impurities by polishing or diamond point turning. Further, other films containing precipitated Te could be used in place of the pure Te film and still provide the gettering. For example, films such as CdTe—Te, Cd—Te, Zn—Te, ZnTe—Te, and so forth, depending upon the substrate material.

Condensation Gettering Copper in CdZnTe

Figure 5:
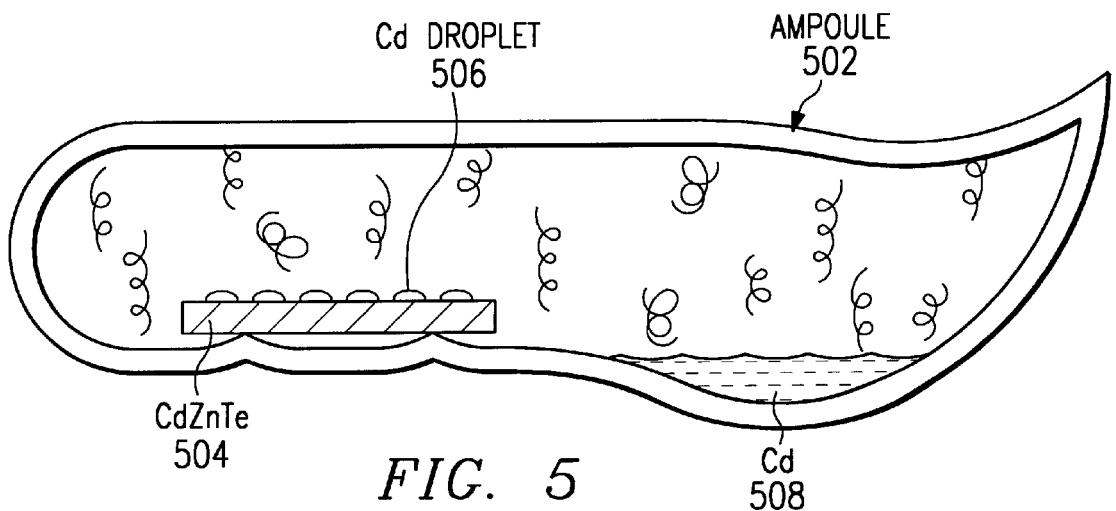
FIG. 5 is a cross sectional elevation view of an ampoule with a substrate plus vapor condensed gettering droplets.

FIG. 5 shows an apparatus for use with a condensation preferred embodiment method of impurity gettering. First, load CdZnTe substrate 504, which typically is about 10 mm by 20 mm by 1 mm thick, plus Cd 508 of about 10–100 mg into ampoule 502 and then evacuate the ampoule to a vacuum of less than 1 mTorr and seal it shut. Next, raise the temperature of the ampoule to about 600–700° C. for a short anneal (about 1 hour); this melts Cd 508 (Cd melting point about 321° C.) and vaporizes some Cd to reach the Cd equilibrium vapor pressure on the order of one atmosphere. After the short anneal, decrease the temperature to 350° C. which nucleates droplets of Cd on substrate 504 from the Cd vapor when the Cd reservoir temperature approaches the temperature of the substrate. The droplets have various diameters and could be fairly widely dispersed on the surface of substrate 504. Maintain the ampoule at 350° C. for about 15 hours to anneal substrate 504 plus allow the Cd droplets to getter fast-diffusing impurities out of substrate 504. Anneals as short as 30 minutes may getter fast diffusing impurities. Experimentally, Cu, Au, Fe, and Ni have been effectively gettered.

After the 15 hour anneal at 350° C., cool to room temperature. The droplets of Cd solidify. Then open the ampoule and extract solid-droplet coated substrate 504 and polish the surface with a diamond tool to remove the solidified Cd droplets together with their gettered impurities. The droplets only create localized and small erosion pits in the substrate surface as compared to solvent extraction using large melts, but the gettering by droplets is about as effective as solvent extraction.

The ampoule walls may also provide nucleation sites, so the ampoule walls should not be much cooler than the substrate.

Gettering Au from CdZnTe

Another condensation preferred embodiment gettering method proceeds in a manner analogous to the first preferred embodiment but uses a down ramp in the temperature instead of holding the substrate at an annealing temperature: namely, load a CdZnTe substrate plus a piece of Cd into an ampoule; evacuate the ampoule; and then seal the ampoule. Now, raise the temperature of the substrate end of the ampoule to about 950° C. and the Cd end of the ampoule to about 1000° C. to melt the Cd and provide a Cd vapor pressure of several atmospheres. Maintain these temperatures for 24 hours, then cool both the substrate and the Cd reservoir so that the substrate and reservoir come to the same temperature, or the substrate becomes slightly cooler than the Cd reservoir. This cooling condenses Cd droplets on the substrate surface and vapor transport of Cd from the reservoir to the substrate. These droplets getter the Au. Experimentally, the second preferred embodiment method applied to a substrate doped homogeneously with Au to a level of about $6 \times 10^{16}/cm^3$ (as measured by secondary ion mass spectroscopy (SIMS)) lowered the Au concentration to roughly the detection limit of the SIMS: about $5 \times 10^{14}/cm^3$.

Modifications

The preferred embodiments may be varied in many ways while retaining one or more of the features of a limited quantitiy of surface gettering material which is liquid or near its melting point.

For example, substrates such as CdTe, CdZnTe, CdMnTe, CdZnMnTe, and so forth can be gettered with compound elements (Cd, Zn, Mn, Te, as so forth) or mixtures of the elements (Cd—Zn, CdTe—Te, CdTe—Cd, and so forth). Also, open ampoules could be used with an inert atmosphere, such as nitrogen, for substrates with capped gettering layers. The inert atmosphere limits the gettering material partial pressure and vapor transport.

What is claimed is:

1. A method of impurity gettering, comprising the steps of:
   (a) providing a substrate with solid gettering material on a surface of said substrate;
   (b) heating said substrate and gettering material to a first temperature greater than the melting point of said gettering material;
   (c) then cooling said substrate and gettering material to a second temperature below said melting point; and
   (d) removing said gettering material from said surface.

2. The method of claim 1, wherein:
   (a) said substrate is a compound semiconductor made of elements from Groups II and VI of the periodic table.

3. The method of claim 2, wherein:
   (a) said substrate includes CdTe; and
   (b) said gettering material is selected from the group consisting of Te, Cd, Zn, Bi, Ga, Sn, and Pb and mixtures thereof.

4. The method of claim 1, further comprising:
   (a) a second material on said surface, said gettering material mixed with said second material.

5. The method of claim 1, further comprising:
   (a) a layer of capping material on said gettering material with said capping material having a melting temperature greater than said first temperature.

6. The method of claim 1, wherein:
   (a) said substrate includes a film of $Hg_{1-x}Cd_xTe$ on a body including CdTe, and said gettering material is on a surface of said body opposite said film.

7. The method of claim 6, further comprising:
   (a) a layer of capping material on said gettering material; and
   (b) said gettering material is Te.

8. A method of impurity gettering, comprising the steps of:
   (a) providing a substrate with solid gettering material on a surface of said substrate;
   (b) heating said substrate and gettering material to a first temperature within 150° C. of the melting point of said gettering material;
   (c) then cooling said substrate and gettering material; and
   (d) removing said gettering material from said surface.

9. The method of claim 8, wherein:
   (a) said substrate includes CdTe; and
   (b) said gettering material is Te.

10. A method of impurity gettering, comprising the steps of:
    (a) providing a substrate in fluid communication with a reservoir of gettering material;
    (b) heating said gettering material to a temperature above its melting point;
    (c) then condensing droplets of said gettering material on said substrate;
    (d) cooling said substrate and gettering material to solidify said droplets; and
    (d) then removing said gettering material from said surface.

11. The method of claim 10, wherein:
    (a) said substrate includes CdTe; and
    (b) said gettering material is selected from the group consisting of Te, Cd, Zn, Bi, Ga, Sn, and Pb and mixtures thereof.

* * * * *